United States Patent
Ganitzer et al.

(10) Patent No.: US 8,211,752 B2
(45) Date of Patent: Jul. 3, 2012

(54) DEVICE AND METHOD INCLUDING A SOLDERING PROCESS

(75) Inventors: Paul Ganitzer, Villach (AT); Francisco Javier Santos Rodriguez, Villach (AT); Martin Sporn, Villach (AT); Daniel Kraft, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 323 days.

(21) Appl. No.: 11/944,722

(22) Filed: Nov. 26, 2007

(65) Prior Publication Data

US 2009/0134501 A1    May 28, 2009

(51) Int. Cl.
*H01L 21/00* (2006.01)

(52) U.S. Cl. ........ 438/121; 438/123; 257/E23.023; 257/E23.026; 257/E23.029

(58) Field of Classification Search ........ 438/106–127
See application file for complete search history.

(56) References Cited

U.S. PATENT DOCUMENTS

| | | | |
|---|---|---|---|
| 5,773,362 A * | 6/1998 | Tonti et al. ............ 438/665 |
| 6,143,432 A * | 11/2000 | de Rochemont et al. ..... 428/689 |
| 6,772,261 B1 | 8/2004 | D'Antonio et al. | |
| 6,872,464 B2 | 3/2005 | Hubner et al. | |
| 7,145,254 B2 * | 12/2006 | Hirano et al. ............. 257/796 |
| 2006/0145352 A1 * | 7/2006 | Soga et al. ............... 257/772 |
| 2007/0025684 A1 * | 2/2007 | Otremba ............... 385/147 |
| 2007/0200219 A1 * | 8/2007 | Otremba ............... 257/692 |
| 2007/0205253 A1 | 9/2007 | Hubner | |
| 2007/0228105 A1 * | 10/2007 | Oshika et al. ............ 228/101 |
| 2008/0230589 A1 * | 9/2008 | Guth et al. .............. 228/193 |

FOREIGN PATENT DOCUMENTS

| | | |
|---|---|---|
| GB | 2296999 A | 7/1996 |
| WO | WO02027789 A1 * | 4/2002 |

OTHER PUBLICATIONS

Machine Translation of WO 02/027789 A1.*
"Rough surface characterization and determination of the rms roughness from coherent light scattering", Frank Elsholz, Technische Universitaet Berlin, Germany, Oct. 22, 2005.

* cited by examiner

*Primary Examiner* — Charles Garber
*Assistant Examiner* — Bryan Junge
(74) *Attorney, Agent, or Firm* — Dicke, Billig & Czaja, PLLC

(57) ABSTRACT

A device and method of making a device is disclosed. One embodiment provides a substrate. A semiconductor chip is provided having a first surface with a roughness of at least 100 nm. A diffusion soldering process is performed to join the first surface of the semiconductor chip to the substrate.

18 Claims, 2 Drawing Sheets

DEVICE AND METHOD INCLUDING A SOLDERING PROCESS

BACKGROUND

This invention relates to a method for making a device including a diffusion soldering method, and a device that is manufactured by using a soldering method.

Soldering is a process in which two or more items, such as metal items, are joined together by melting and flowing a solder material into the joint. Semiconductor chips, for example power semiconductor chips, may be mounted on substrates or other semiconductor chips by using soldering methods. Power semiconductor chips are suitable for the switching or control of currents and/or voltages. Power semiconductor chips may be configured as power transistors, power diodes or IGBTs (Insulated Gate Bipolar Transistors).

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
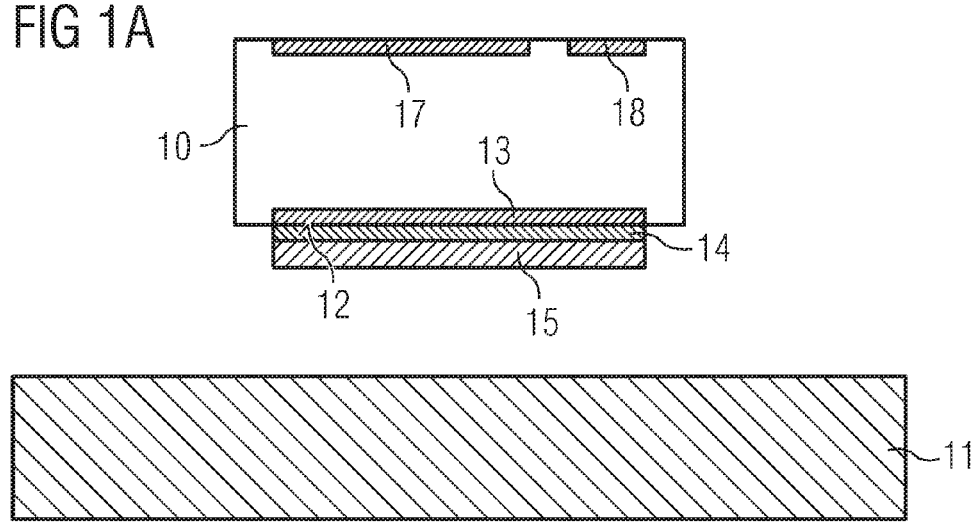
FIGS. 1A and 1B schematically illustrate one example embodiment of a method to fabricate a device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power semiconductor chips, such as power transistors, power diodes or IGBTs (Insulated Gate Bipolar Transistors). Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements on its two main surfaces, that is to say on its top side and bottom side. In one embodiment, power transistors, power diodes and IGBTs may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied in one embodiment as a Schottky diode. Furthermore, the devices described below may include integrated circuits to control the integrated circuits of other semiconductor chips, for example, the integrated circuits of power transistors or power diodes. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips are mounted on substrates. The substrates may be of any shape, size or material. During the fabrication of the devices the substrate may be provided in a way that other substrates are arranged in the vicinity and are connected by connection means to said substrate with the purpose of separating said substrates. The substrate may be fabricated from metals or metal alloys, copper, copper alloys, iron nickel, aluminum, aluminum alloys, or other materials. It may further be electrically conductive. The substrate may be, for example, a leadframe or a part of a leadframe, such as a die pad. Furthermore, the substrates may be plated with an electrically conductive material, for example copper, silver, iron nickel or nickel phosphorus.

Solder material may be deposited on the semiconductor chips, in one embodiment one or more electrodes of the semiconductor chips. If diffusion soldering is used as a connecting technique to connect the semiconductor chips to the substrates, solder materials are used which lead to intermetallic phases after the end of the soldering operation at the interface between the semiconductor chip and the substrate on account of interface diffusion processes. In this case, the use of AuSn, AgSn, CuSn, Sn, AgIn, or CuIn solders is conceivable. Alternatively, the solder material may be deposited on the substrate.

Figure 1B:
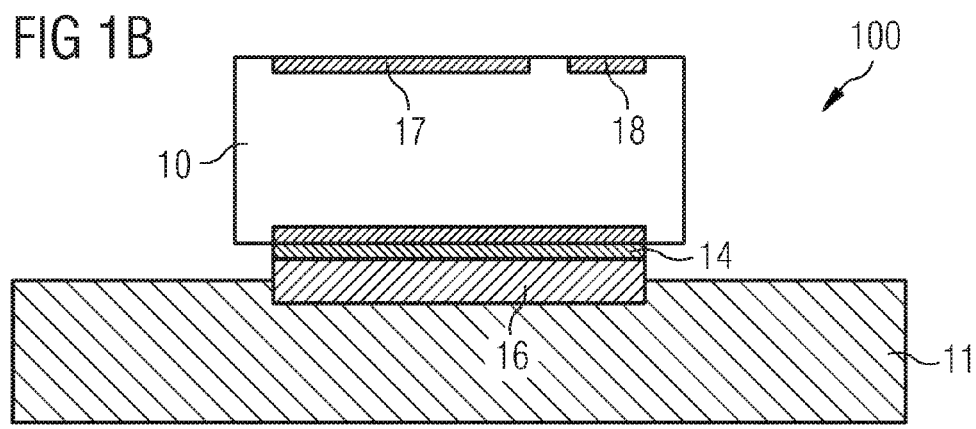

FIGS. 1A and 1B schematically illustrate a method to manufacture a device 100 illustrated in FIG. 1B in cross section. Firstly, a semiconductor chip 10 and a substrate 11 are provided. The semiconductor chip 10 has a first surface 12 which has a roughness of more than 100 nm. The roughness of the first surface 12 may also be higher than 200 nm, 300 nm, 400 nm or 500 nm. Furthermore, the roughness of the first surface may be lower than 1000 nm, 1100 nm, 1200 nm 1300 nm, 1400 nm or 1500 nm.

The minimum and maximum roughness values given above may represent the rms (root mean square) roughness of the first surface 12. The rms roughness is commonly used as the basic quantity for surface roughness characterization. For the sake of simplicity, it is assumed that the height profile of a given surface is a single-valued function of the point coordinate h(x), i.e., there are no voids or overhangs. The rms roughness $R_{rms}$ is a simple measure of the roughness of the height profile and may be defined as:

$$R_{rms} = \sqrt{\frac{1}{N}\sum_{i=1}^{N}(h(x_i) - \bar{h})} \quad (1)$$

In equation (1) N is the number of lattice points, $h(x_i)$ is the height at the lattice site $x_i$, and the average height $\bar{h}$ of the profile is:

$$\bar{h} = \frac{1}{N}\sum_{i=1}^{N}h(x_i) \quad (2)$$

The rms roughness describes the fluctuations of surface heights around an average surface height and is the standard deviation or the square root of the second cumulant (variance) in terms of statistics. Definitions of the rms roughness that are similar to the one given above may alternatively be used. The roughness may be measured by an AFM (atomic force microscope).

It may be provided that the first surface 12 is an entire main surface of the semiconductor chip 10, but the first surface 12 may also be only a part of an entire main surface of the semiconductor chip 10. For example, the first surface 12 may be an active main surface of the semiconductor chip 10. Furthermore, an electrode 13 may be located at the main surface and the first surface 12 may be at least a part of the surface of the electrode 13.

The roughness of the first surface 12 may be generated by wetting the first surface 12 with a solution containing $H_2SO_4$, HF and $HNO_3$ for an appropriate time duration. As an alternative, the roughness may be generated by plasma etching using a $SF_6/O_2$ gas or a $N_2O_2$ gas. Other appropriate techniques may alternatively be used.

A metal layer 14 may be attached to the first surface 12 or a part thereof. The metal layer 14 may be deposited by a vacuum deposition method, such as sputtering, or other appropriate physical or chemical deposition methods and may have a thickness in the range from 50 to 300 nm, in one embodiment in the range from 100 to 200 nm, but may also be thinner or thicker. Aluminum, titanium, gold, silver, copper, palladium, platinum, nickel, chromium or nickel vanadium may be used as the material. The metal layer 14 may have a surface roughness of more than 100 nm, in one embodiment more than 200 nm, 300 nm, 400 nm or 500 nm.

A solder material 15 may be deposited on the metal layer 14. The solder material 15 may be sputtered onto the metal layer 14 (or may be deposited using other appropriate physical or chemical deposition methods) and may have a thickness in the range from 500 nm to 3 μm, in one embodiment in the range from 1 to 2 μm. The solder material 15 may, for example, consist of AuSn, AgSn, CuSn, Sn, AgIn or CuIn.

The substrate 11 may be made of an electrically conductive material, such as a metal or metal alloy, for example copper, copper alloys, iron nickel or other appropriate materials. The substrate 11 may be a leadframe or a part of a leadframe, such as a die pad. Furthermore, the substrate 11 may be coated with an electrically conductive material, for example copper, silver, iron nickel or nickel phosphorus. Alternatively, the substrate 11 may be a further semiconductor chip having a metallic electrode or coating on its top surface.

In order to join the first surface 12 of the semiconductor chip 10 to the substrate 11, a diffusion soldering process may be used. For producing the soldered joint, the substrate 11 may be heated by a hot plate to a temperature above the melting point of the solder material 15, for example in the range from 300 to 400° C., in one embodiment in the range from 330 to 350° C. Alternatively, both the semiconductor chip 10 and the substrate 11 may be placed in an oven and heated to an appropriate temperature. A pick-and-place tool may be used capable of picking the semiconductor chip 10 and placing it on the heated substrate 11. During the soldering process the semiconductor chip 10 may be pressed onto the substrate 11 for an appropriate time in the range between 10 and 200 ms, in particular around 50 ms.

During the soldering process the solder material 15 produces a metallic joint between the semiconductor chip 10 and the substrate 11 which is able to withstand high temperatures through the fact that the solder material 15 forms a temperature-resistant and highly mechanically stable intermetallic phase with high-melting materials of the semiconductor chip 10 and the substrate 11 which are to be joined. In the process, the low-melting solder material 15 is completely transformed, i.e. it passes completely into the intermetallic phase. The process is diffusion-controlled and its duration increases as the thickness of the solder material layer 15 rises.

The intermetallic phase produced by the diffusion soldering process at the interface between the semiconductor chip 10 and the substrate 11 is illustrated in FIG. 1B and is denoted there by the reference numeral 16.

The semiconductor chip 10 may be a power semiconductor chip, for example a power transistor or a power diode or an IGBT. In the present embodiment, the semiconductor chip 10 is a vertical power transistor, for example a MOSFET, and includes a drain electrode as the electrode 13 on its lower main surface and a source electrode 17 and a gate electrode 18 on its upper main surface.

Figure 2:
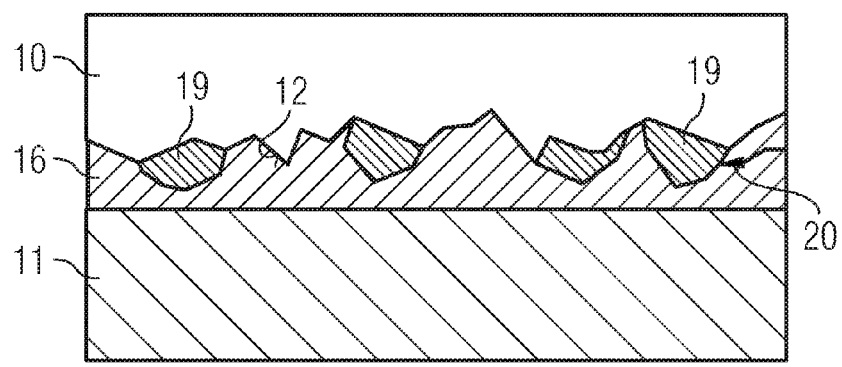
FIG. 2 schematically illustrates a section of the interface between a semiconductor chip and a substrate of the device.

FIG. 2 schematically illustrates a section of the interface between the semiconductor chip 10 and the substrate 11 of the device 100 in cross section. In FIG. 2 the rough surface of the first surface 12 is illustrated (the metal layer 14 is not illustrated). Furthermore, the intermetallic phase 16 between the semiconductor chip 10 and the substrate 11 is depicted in FIG. 2. During the soldering process, micro voids 19 may be generated adjacent to the first surface 12. The micro voids 19 may have a diameter in the micrometer range and their generation is due to the roughness of the first surface 12. The micro voids 19 may be distributed evenly over the intermetallic phase 16. The portion of the micro voids 19 in the intermetallic phase 16 is subcritical so that the micro voids 19 do not influence the electrical conductivity between the semiconductor chip 10 and the substrate 11. However, the micro voids 19 may reduce thermomechanical stress which may be originated from the different thermal expansion coefficients of the semiconductor chip 10 and the substrate 11. If a crack occurs in the intermetallic phase 16 caused by shear stress, this crack may be stopped by one of the micro voids 19 as indicated by an arrow 20 in FIG. 2. Thus the micro voids 19 prevent a complete break of the solder joint.

Moreover, the roughness of the first surface 12 may facilitate a proper connection between the semiconductor chip 10 and the substrate 11 in case the semiconductor chip 10 is not coplanarly attached to the substrate 11. If the surface of the semiconductor chip 10 is smooth and the semiconductor chip 10 is slightly tilted when attached to the substrate 11, the edge of the semiconductor chip 10 that touches the substrate 11 first may immediately form a solder joint with the substrate 11 so that only a fraction of the lower surface of the semiconductor chip 10 is in electrical contact with the substrate 11. The roughness of the first surface 12 described herein, however, delays the reaction with the substrate 11. Thus, even if the semiconductor chip 10 is slightly tilted when attached to the substrate 11, the roughness of the first surface 12 allows to properly mount the semiconductor chip 10 on the substrate 11 so that the entire first surface 12 is in contact with the substrate 11.

The metal layer 14, which is arranged between the electrode 13 and the solder material 15 may function as a diffusion barrier which protects the semiconductor material of the semiconductor chip 10 from the solder material 15 during the soldering process. Another function of the metal layer 14 may be that of an adhesion layer, which enables the solder material 15 to adhere to the semiconductor chip 10.

In one embodiment, it may be provided that the solder material 15 is directly deposited onto the semiconductor material of the semiconductor chip 10. This is, for example, depicted in FIG. 3.

Figure 4:
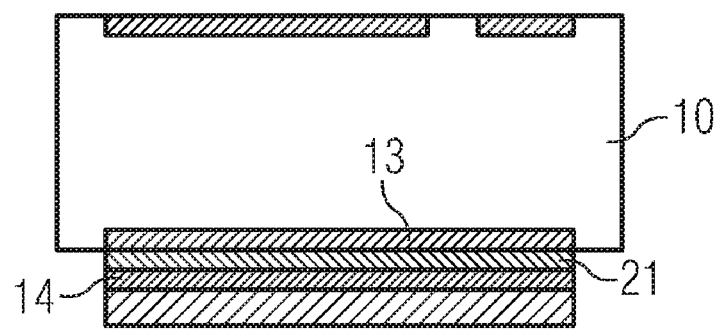
FIG. 4 schematically illustrates the semiconductor chip and stacked metal layers and as well as the solder material deposited on the semiconductor chip according to one example embodiment.

According to a further embodiment, a further metal layer 21 is arranged between the electrode 13 and the metal layer 14 as illustrated in FIG. 4. The metal layer 21 may consist of aluminum or any other metal or metal alloy and may serve to make an electrical contact to the semiconductor chip 10. If the doping level of the electrode 13 is high enough, the metal layer 21 may be omitted as illustrated in FIG. 1A.

Figure 3:
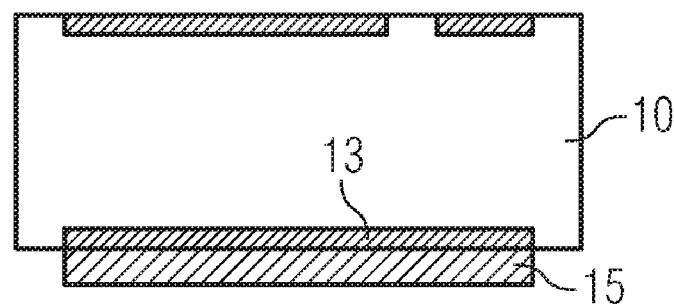
FIG. 3 schematically illustrates the semiconductor chip and solder material deposited on the semiconductor chip according to one example embodiment.
Figure 5:
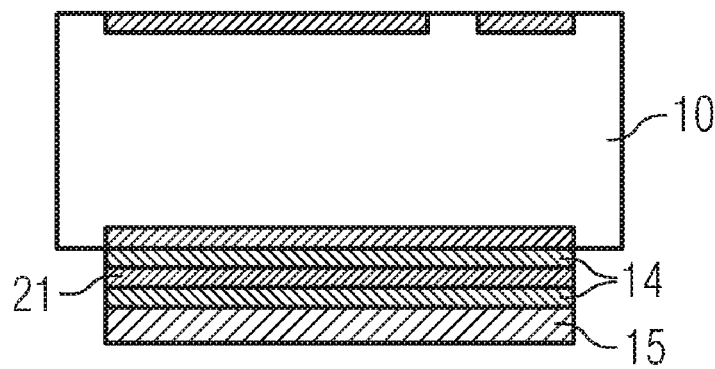
FIG. 5 schematically illustrates the semiconductor chip and stacked metal layers and as well as the solder material deposited on the semiconductor chip according to one example embodiment.

It is obvious to a person skilled in the art that the metal layers stacked on the semiconductor chip 10 as illustrated in FIGS. 1A, 3 and 4 are only intended to be exemplary embodiments, and many variations are possible. For example, the metal layers 14, 21 and 14 may be stacked on the semiconductor chip 10 as schematically illustrated in FIG. 5. The metal layers 14 may be titanium layers, and the metal layer 21 may be an aluminum layer. However, other materials may be also used for the layers 14 and 21, for example gold, silver, copper, palladium, platinum, nickel, chromium or nickel vanadium.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing a substrate;
   providing a semiconductor chip comprising a semiconductor material exposed at a first surface;
   increasing a roughness of the semiconductor material exposed at the first surface to a roughness of more than 500 nm;
   depositing at least one metal layer on the first surface of the semiconductor chip after increasing the roughness, wherein the at least one metal layer has a roughness of more than 500 nm; and
   performing a diffusion soldering process to join the first surface of the semiconductor chip to the substrate after deposition of the at least one metal layer.

2. The method of claim 1, comprising depositing a solder material directly on the at least one metal layer on the first surface of the semiconductor chip prior to the diffusion soldering process.

3. The method of claim 2, comprising:
   arranging an electrode on the first surface of the semiconductor chip; and
   depositing the solder material on the electrode.

4. The method of claim 2, wherein the at least one metal layer comprises a single metal layer deposited directly on the first surface of the semiconductor chip.

5. The method of claim 1, comprising wherein the roughness of the first surface of the semiconductor chip is lower than 1500 nm.

6. The method of claim 1, comprising wherein the semiconductor chip is a power semiconductor chip.

7. The method of claim 1, where the at least one metal layer comprises a titanium layer, and wherein depositing the solder material comprises depositing the solder material onto the titanium layer.

8. The method of claim 1, wherein including generating the roughness of the first surface using an etching process.

9. The method of claim 1, including generating micro voids adjacent to the roughened first surface during the diffusion soldering process.

10. A method, comprising:
providing a substrate;
providing a semiconductor chip having a semiconductor material exposed at a first surface;
increasing a roughness of the semiconductor material at the first surface to a roughness of more than 500 nm;
depositing a single metal layer on the first surface after increasing the roughness of the semiconductor material, wherein the single metal layer has a roughness of more than 500 nm;
depositing a solder material on the single metal layer of the first surface; and
mounting the semiconductor chip on the substrate with the first surface facing the substrate,
wherein the single metal layer is a titanium layer deposited directly onto the first surface of the semiconductor chip, and wherein the solder material is deposited directly onto the titanium layer.

11. The method of claim 10, comprising applying heat when the semiconductor chip is mounted on the substrate.

12. The method of claim 10, comprising heating the substrate to a temperature above the melting temperature of the solder material.

13. The method of claim 10, comprising manufacturing the substrate from a metal.

14. The method of claim 10, comprising wherein the roughness of the first surface of the semiconductor chip is lower than 1500 nm.

15. The method of claim 10, comprising wherein the semiconductor chip is a power semiconductor chip.

16. The method of claim 10, comprising:
arranging an electrode on the first surface of the semiconductor chip; and
depositing the solder material on the electrode.

17. The method of claim 10, comprising wherein the solder material is gold tin or silver tin.

18. A method, comprising:
providing a metal substrate;
providing a semiconductor chip having an electrode, the electrode comprising a semiconductor material;
increasing a surface roughness of the semiconductor material to a roughness of more than 500 nm;
depositing at least one metal layer on the electrode after increasing the roughness of the semiconductor material, wherein the at least one metal layer has a roughness of more than 500 nm;
depositing a solder material on the at least one metal layer; and
joining the electrode to the metal substrate by diffusion soldering.

* * * * *